(12) United States Patent
Kim

(10) Patent No.: US 7,767,566 B2
(45) Date of Patent: Aug. 3, 2010

(54) FLASH MEMORY DEVICE AND METHOD OF FORMING THE DEVICE

(75) Inventor: Sung-Jin Kim, Busan (KR)

(73) Assignee: Dongbu HiTek Co., Ltd., Seoul (KR)

( * ) Notice: Subject to any disclaimer, the term of this patent is extended or adjusted under 35 U.S.C. 154(b) by 188 days.

(21) Appl. No.: 11/963,563

(22) Filed: Dec. 21, 2007

(65) Prior Publication Data

US 2008/0157180 A1 Jul. 3, 2008

(30) Foreign Application Priority Data

Dec. 29, 2006 (KR) ...................... 10-2006-0137347

(51) Int. Cl.
*H01L 21/00* (2006.01)
(52) U.S. Cl. .................. 438/586; 438/258; 438/201
(58) Field of Classification Search ................ 438/586, 438/258, 201
See application file for complete search history.

(56) References Cited

U.S. PATENT DOCUMENTS

| | | | | |
|---|---|---|---|---|
| 4,975,754 A * | 12/1990 | Ishiuchi et al. | ............... | 257/329 |
| 6,101,120 A * | 8/2000 | Ishida | ........................ | 365/156 |
| 6,137,134 A * | 10/2000 | Nakagawa | ................... | 257/316 |
| 6,507,124 B2 * | 1/2003 | Kumagai et al. | ............ | 257/414 |
| 6,525,350 B1 * | 2/2003 | Kinoshita et al. | ........... | 257/202 |
| 6,537,877 B2 * | 3/2003 | Ishida | ........................ | 438/258 |
| 6,747,321 B2 * | 6/2004 | Kanamori | .................... | 257/382 |
| 6,898,109 B2 * | 5/2005 | Hirose et al. | ................ | 365/149 |
| 6,981,240 B2 * | 12/2005 | Pierrat et al. | .................. | 716/19 |
| 7,135,746 B2 * | 11/2006 | Kim et al. | .................... | 257/393 |
| 7,276,404 B2 * | 10/2007 | Kim et al. | .................... | 438/153 |
| 2002/0072167 A1 * | 6/2002 | Lee et al. | .................... | 438/201 |
| 2003/0111695 A1 * | 6/2003 | Kanamori | .................... | 257/384 |
| 2008/0157180 A1 * | 7/2008 | Kim | .......................... | 257/321 |
| 2008/0315323 A1 * | 12/2008 | Moon | ......................... | 257/390 |
| 2009/0154240 A1 * | 6/2009 | Park et al. | ............. | 365/185.05 |
| 2009/0263749 A1 * | 10/2009 | Sim et al. | .................... | 430/319 |

\* cited by examiner

*Primary Examiner*—Laura M Menz
(74) *Attorney, Agent, or Firm*—Sherr & Vaughn, PLLC

(57) ABSTRACT

Cell gate patterns including first portions separated from each other with a first distance and second portions separated from each other with a second distance less than the first distance, and spacers are formed both sidewalls of the pair of cell gate patterns. The spacers formed on the sidewalls of the second portions are removed using a mask pattern. Accordingly, it is possible to prevent increase of an aspect ratio of a gap between the second portions with the small distance. Since the spacers formed on the sidewalls of the second portions separated from each other with the small distance are selectively removed, it is possible to minimize the increase of the aspect ratio of the gap between the second portions. Thus, it is possible to solve various problems which are caused due to occurrence of a void.

6 Claims, 3 Drawing Sheets

FLASH MEMORY DEVICE AND METHOD OF FORMING THE DEVICE

The present application claims priority under 35 U.S.C. 119 to Korean Patent Application No. 10-2006-0137347 (filed on Dec. 29, 2006), which is hereby incorporated by reference in its entirety.

BACKGROUND

A semiconductor device such as a flash memory device has a non-volatile characteristic in which stored data may be held although the power supply is stopped. The flash memory device can electrically write or erase data. The flash memory device may store data using a difference in a threshold voltage of cells of transistor type according to existence of charges in floating gates isolated electrically. Meaning, data having a logic level "0" and a logic level "1" may be stored by storing charges in the floating gates or discharging charges from the floating gates.

In order to achieve high integration, unit patterns configuring the flash memory device may be changed in various configuration, in order to reduce a unit cell area. For example, gate patterns, which may be used as word lines of the flash memory device, may include bent portions in order to form contact plugs adjacent thereto.

Figure 1:
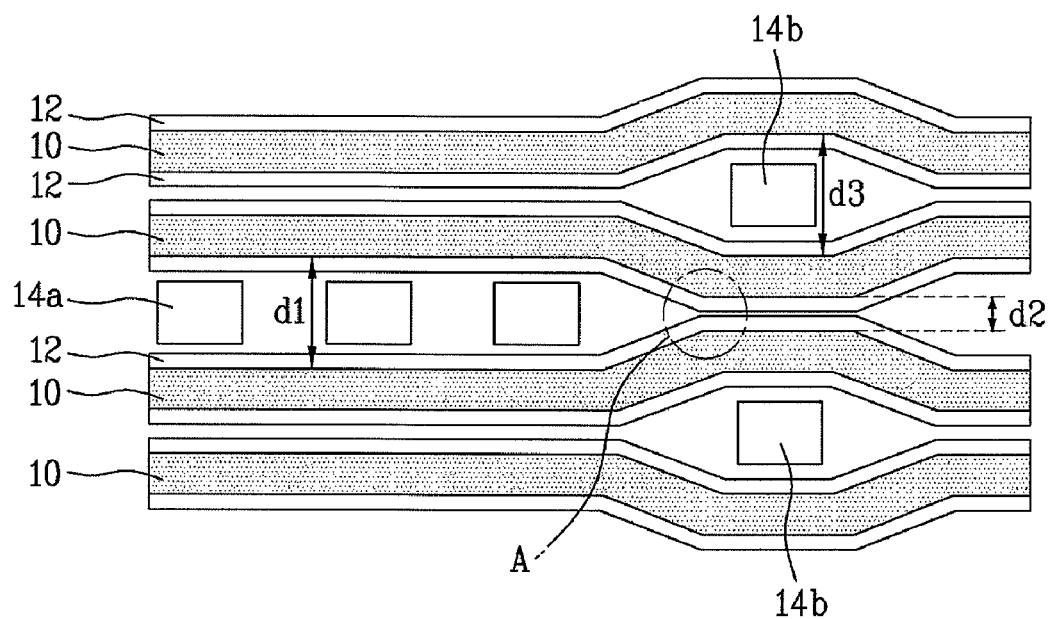

As illustrated in example FIG. 1, a flash memory device can include plurality of cell gate patterns 10 arranged in parallel on and/or over a semiconductor substrate. Each cell gate pattern 10 may include a first portion extending in a straight-line and a bent second portion. Cell gate patterns 10 having the first and second portions may be symmetrically arranged in a single direction. Accordingly, the first portions of a pair of adjacent cell gate patterns 10 may be separated from each other with first distance d1 and the second portions of the pair of adjacent cell gate patterns 10 may be separated from each other with second distance d2. Second distance d2 may be lesser than first distance d1. Since the second portions of the pair of cell gate patterns 10 may be formed with second distance d2, the second portion of another cell gate pattern 10 adjacent to the second portions of the pair of cell gate patterns 10 may be separated from each other with third distance d3 that is greater than second distance d2.

Spacers 12 may be formed on both sidewalls of cell gate patterns 10. A plurality of first contact plugs 14a may be arranged separate from each other between the first portions which are separated from each other with first distance d1, and second contact plugs 14b may be provided at both sides of the second portions. First contact plugs 14a and second contact plugs 14b may penetrate through an oxide film for covering cell gate patterns 10 and spacers 12 to contact the semiconductor substrate.

Second distance d2 between the second portions may be very small as denoted by portion A. In addition, spacer 12 may be present between the second portions in portion A. Accordingly, an aspect ratio of a gap which is present in portion A may significantly increase. As a result, the oxide film for covering cell gate patterns 10 and spacers 12 may not fill the gap which is present in portion A, thereby forming a void. Accordingly, a conductive material for forming first contact plugs 14a and second contact plugs 14b may be filled in the gap of portion A. Thus, an electrical bridge phenomenon occurs to cause failure of the flash memory device.

SUMMARY

Embodiments relate to a flash memory device that can minimize an increase in the aspect ratio of a relatively narrow portion of a pair of cell gate patterns.

Embodiments relate to a method of forming a flash memory device that can include at least one of the following steps: forming a plurality of cell gate patterns over a semiconductor substrate including a first cell gate pattern, a second cell gate pattern adjacent to the first cell gate pattern, a third cell gate pattern adjacent to the second cell gate pattern and fourth cell gate pattern adjacent to the third cell gate pattern, each cell gate pattern having a first portion and a second portion, wherein the first portions of the second cell gate pattern and the third cell gate pattern are separated from each by a first distance and the second portions of the second cell gate pattern and the third cell gate pattern are separated from each other by a second distance smaller than the first distance; forming spacers on both sidewalls of the cell gate patterns; forming a mask pattern covering the first portions of the cell gate patterns; removing the spacers formed on sidewalls of the second portions of the cell gate patterns using the mask pattern as an etching mask; and then removing the mask pattern.

Embodiments relate to a flash memory device that can include at least one of the following: a plurality of cell gate patterns extending in a single direction and each having a first portion and a second portion formed over a semiconductor substrate including a first cell gate pattern, a second cell gate pattern adjacent to the first cell gate pattern, a third cell gate pattern adjacent to the second cell gate pattern and fourth cell gate pattern adjacent to the third cell gate pattern; and spacers formed on sidewalls of the first portions of the cell gate patterns. In accordance with embodiments, the first portions of the second cell gate pattern and the third cell gate pattern can be separated from each by a first distance and the second portions of the second cell gate pattern and the third cell gate pattern can be separated from each other by a second distance less than the first distance.

Embodiments relate to a method of forming a flash memory device that can include at least one of the following steps: forming a plurality of cell gate patterns each having a first portion and a second portion over a semiconductor substrate including a first cell gate pattern, a second cell gate pattern adjacent to the first cell gate pattern, a third cell gate pattern adjacent to the second cell gate pattern and fourth cell gate pattern adjacent to the third cell gate pattern; and then forming spacers formed on sidewalls of the first portions of the cell gate patterns. In accordance with embodiments, the first portions of the second cell gate pattern and the third cell gate pattern can be separated from each by a first distance, the second portions of the second cell gate pattern and the third cell gate pattern can be separated from each other by a second distance which is less than the first distance, the first portions of the first cell gate pattern and the second cell gate pattern can be separated from each other by a third distance that is at least one of equal to and less than the first distance, and the second portions of the first cell gate pattern and the second cell gate pattern can be separated from each other by a fourth distance which is greater than the second distance.

DRAWINGS

Example FIG. 1 illustrates a flash memory device.

Example FIGS. 2 to 6 illustrate a flash memory device and a method thereof, in accordance with embodiments.

DESCRIPTION

Figure 2:
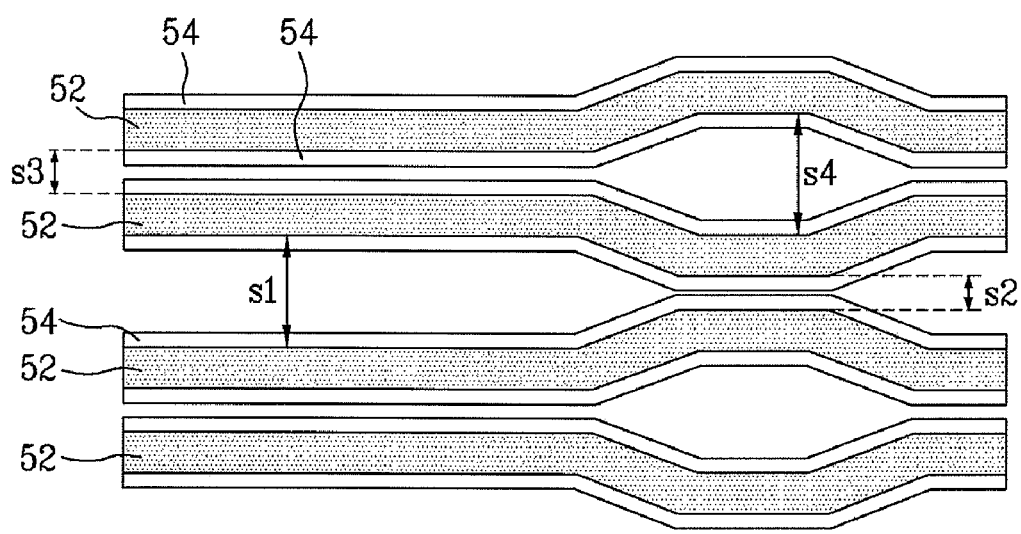

As illustrated in example FIG. 2, a plurality of cell gate patterns 52 extending in a first direction can be formed on and/or over semiconductor substrate 50. Cell gate patterns 52 can include a plurality of floating gates for storing data. Cell gate patterns 52 can include a first portion extending in a substantially straight line in the first direction and a second portion having a bent configuration. The length of the second portion can be smaller than that of the first portion. Second portions can have a substantially semi-circular configuration. Cell gate patterns 52 can be symmetrically arranged in a second direction perpendicular to the first direction.

Among the plurality of cell gate patterns 52, the first portions of a first pair of adjacent cell gate patterns 52 can be separated from each other by first distance s1. The second portions of the first pair of cell gate patterns 52 can be separated from each other by second distance s2. Second distance s2 can be smaller than first distance s1.

In contrast, among the plurality of cell gate patterns 52, the first portions of a second pair of adjacent cell gate patterns 52 can be separated from each other by third distance s3. The second portions of the second pair of cell gate patterns 52 can be separated from each other by fourth distance s4. Fourth distance s4 can be greater than second distance s2. Third distance s3 may be smaller than first distance s1. Alternatively, first distance s1 and third distance s3 may be equal to each other.

Spacers 54 can be formed on both sidewalls of each cell gate pattern 52. Spacers 54 can be formed of an insulating material such as at least one of an oxide film, a nitride film and an oxynitride film.

Figure 3:
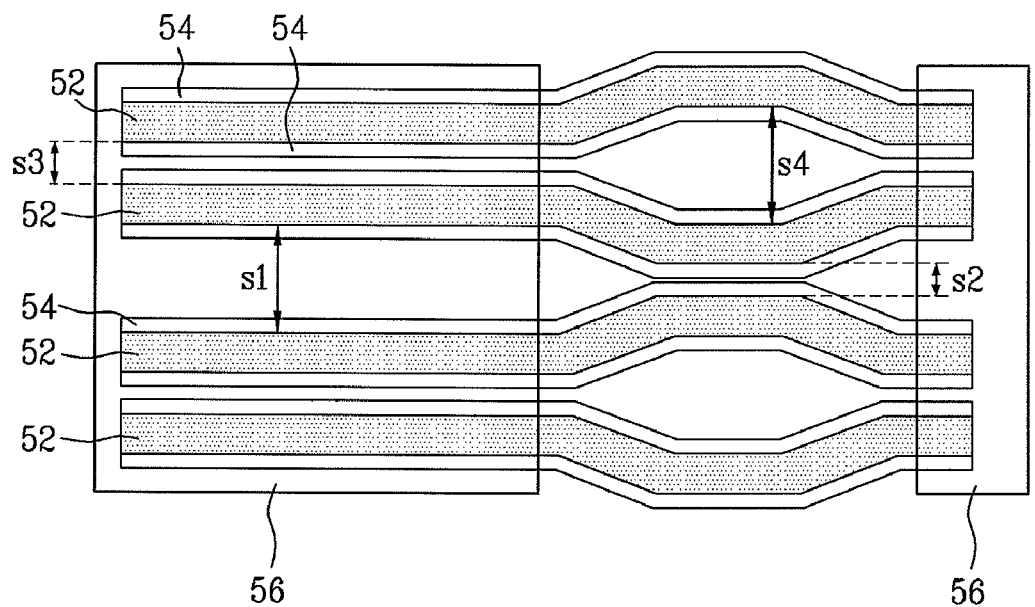

As illustrated in example FIG. 3, mask pattern 56 can be formed on and/or over the semiconductor substrate. Mask pattern 56 can cover spacers 54 at the first portions of cell gate patterns 52 and also at spacers 54 formed on sidewalls of the first portions. In contrast, the second portions of cell gate patterns 52 and spacers 54 formed on sidewalls of the second portions can be exposed.

Figure 4:
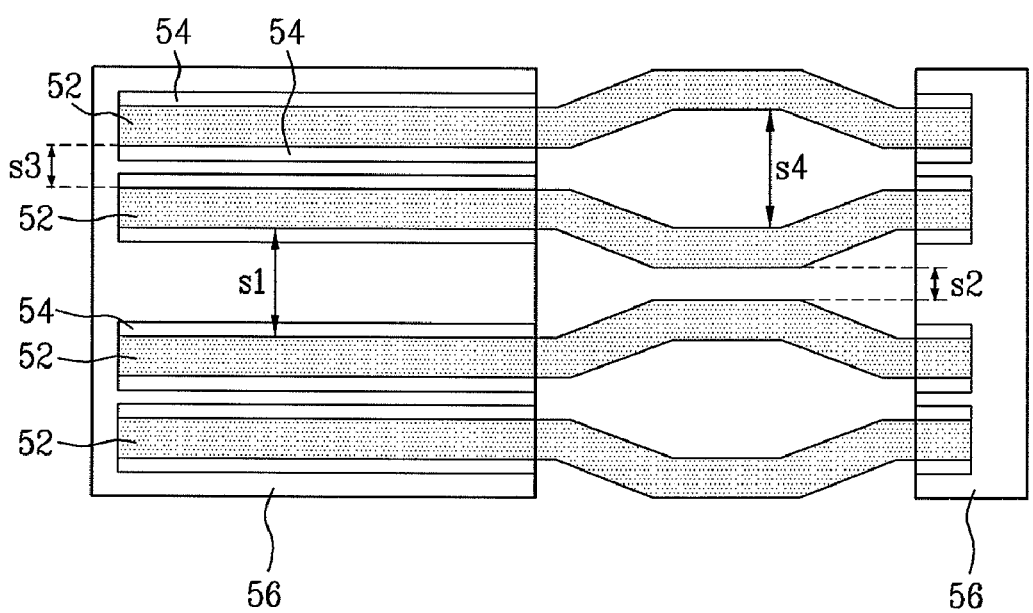

As illustrated in example FIG. 4, spacers 54 can then be etched and removed using mask pattern 56 as an etching mask to remove spacers 54 formed on sidewalls of the second portions of cell gate patterns 52. In contrast, spacers 54 formed on the sidewalls of the first portions of cell gate patterns 52 remain.

Figure 5:
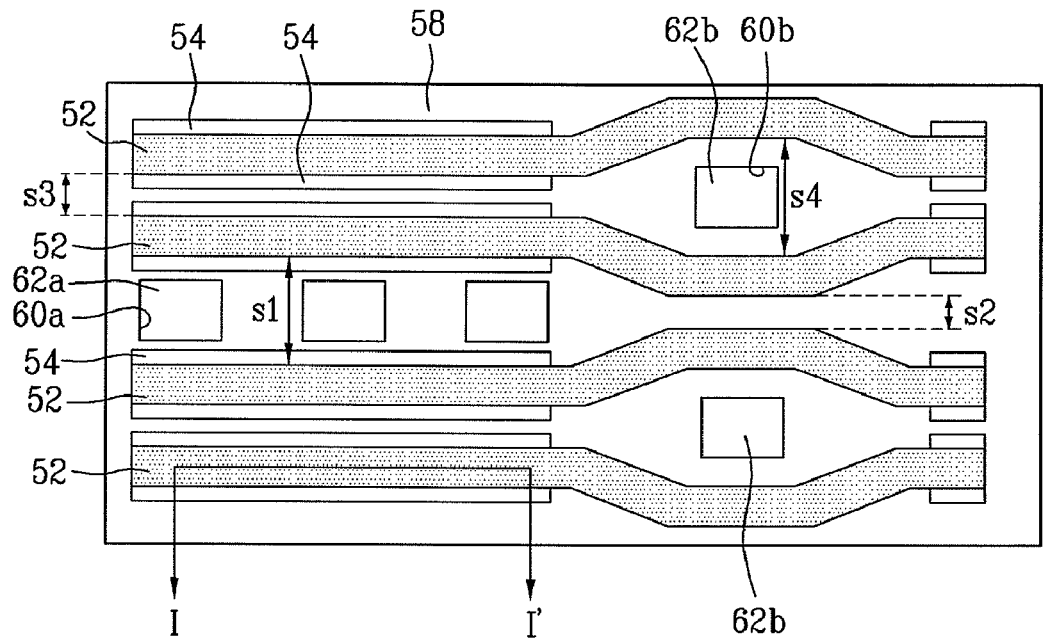
Figure 6:
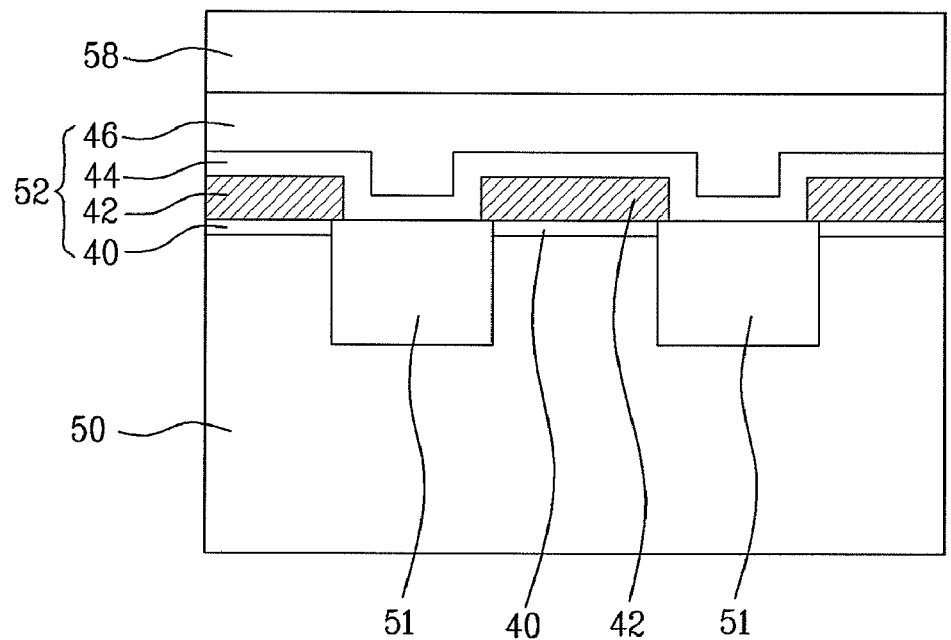

As illustrated in example FIGS. 5 and 6, mask pattern 56 can then be removed. As illustrated in example FIG. 6, semiconductor substrate 50 is provided under cell patterns 52. Planarization insulating film 58 can then be formed on and/or over semiconductor substrate 50 from which mask pattern 56 is removed. Spacers 54 may not be present between the second portions of first pair of cell gate patterns 52 separated from each other by second distance s2. Accordingly, an aspect ratio of a gap between the second portions of the first pair of cell gate patterns 52 can be reduced. As a result, planarization insulating film 58 can sufficiently fill the gap between the second portions of the first pair of cell gate patterns 52. Accordingly, it can be possible to prevent a void from occurring to prevent failure of the flash memory device.

Planarization insulating film 58 can then be patterned to form a plurality of first contact holes 60a and a plurality of second contact holes 60b exposing semiconductor substrate 50. First contact holes 60a can be formed between the first portions of the first pair of cell gate patterns 52 to be separated from each other. Second contact holes 60b can be formed at the both sides of the second portions of the first pair of cell gate patterns 52. Particularly, second contact holes 60b can be formed between the second portions of the second pair of cell gate patterns 52.

Drain regions of flash memory cells can be provided on and/or over semiconductor substrate 50 exposed by first contact holes 60a. Doping regions connected to source regions of the flash memory cells can be provided on and/or over semiconductor substrate 50 exposed by second contact holes 60b.

A conductive film filling first contact holes 60a and second contact holes 60b can then be formed on and/or over the entire surface of semiconductor substrate 50. The conductive film can then be planarized until planarization insulating film 58 is exposed to form first contact plugs 62a and second contact plugs 62b filling first contact holes 60a and second contact holes 60b. First contact plugs 62a and second contact plugs 62b can be composed of a conductive material such as tungsten.

As illustrated in example FIG. 6, the structure of cell gate pattern 52 can include device isolation films 51 defining active regions formed in semiconductor substrate 50. Cell gate pattern 52 can further include tunnel insulating films 40 formed on and/or over semiconductor substrate 50 and floating gates 42 formed over tunnel insulating films 40. Blocking insulating pattern 44 can be formed on and/or over semiconductor substrate 50 including device isolation films 51 and floating gates 42. Control gate electrode 46 can be formed over blocking insulating pattern 42 and traverses active regions defined by a device isolation film 51.

Accordingly, floating gate 42 is interposed between the active region and control gate electrode 46. Floating gate 42 can be interposed between the active region and the control gate electrode 46 configuring the first portion of cell gate pattern 52. Tunnel insulating film 40 can be interposed between the active region and floating gate 42, and blocking insulating pattern 44 can be interposed between control gate electrode 46 and floating gate 42.

As described above, in accordance with embodiments, a pair of cell gate patterns can include first portions separated from each other with a relatively large distance and second portions separated from each other with a relatively small distance. Since the spacers formed on sidewalls of the second portions separated from each other with the relatively small distance are selectively removed, it can be possible to minimize increase of an aspect ratio of a gap between the second portions. Accordingly, can be possible to solve various problems which are caused due to occurrence of a void.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:

forming a plurality of cell gate patterns over a semiconductor substrate including a first cell gate pattern, a second cell gate pattern adjacent to the first cell gate pattern, a third cell gate pattern adjacent to the second cell gate pattern and a fourth cell gate pattern adjacent to the third cell gate pattern, each cell gate pattern having a first portion and a second portion, wherein the first portion of the second cell gate pattern and the third cell gate pattern are separated from each other by a first distance and the second portions of the second cell gate pattern and the third cell gate pattern are separated from each other by a second distance less than the first distance;

forming spacers on both sidewalls of the cell gate patterns;

forming a mask pattern covering the first portions of the cell gate patterns;

removing the spacers formed on sidewalls of the second portions of the cell gate patterns using the mask pattern as an etching mask; and removing the mask pattern.

2. The method of claim 1, wherein the first portions of the first cell gate pattern and the second cell gate pattern are separated from each other by a third distance and second portions of the first cell gate pattern and the second cell gate pattern are separated from each other by a fourth distance.

3. The method of claim 2, wherein the first distance is equal to the third distance.

4. The method of claim 2, wherein the third distance is less than the first distance.

5. The method of claim 2, further comprising: after removing the mask pattern, forming a planarization insulating film over the entire surface of the semiconductor substrate;

forming a plurality of first contact holes in the planarization insulating film exposing the semiconductor substrate and between the first portions of the second cell gate pattern and the third cell gate pattern, forming second contact holes in the planarization film exposing the semiconductor substrate and between the second portions of the first cell gate pattern and the second cell gate pattern; and then forming a contact plug in the first and second contact holes.

6. The method of claim 5, wherein forming the plurality of first contact holes comprises patterning the planarization insulating film.

* * * * *